US012725658B2

(12) United States Patent
Shin et al.

(10) Patent No.: US 12,725,658 B2

(45) Date of Patent: Sep. 1, 2026

(54) MEMORY DEVICE AND METHOD OF PERFORMING PROGRAM OPERATION

(71) Applicant: SK hynix Inc., Icheon-si (KR)

(72) Inventors: Hyun Seob Shin, Icheon-si (KR); Yeong Jo Mun, Icheon-si (KR); Sung Hyun Hwang, Icheon-si (KR)

(73) Assignee: SK hynix Inc., Icheon-si (KR)

(*) Notice: Subject to any disclaimer, the term of this patent is extended or adjusted under 35 U.S.C. 154(b) by 55 days.

(21) Appl. No.: 18/910,277

(22) Filed: Oct. 9, 2024

(65) Prior Publication Data

US 2025/0308592 A1 Oct. 2, 2025

(30) Foreign Application Priority Data

Mar. 29, 2024 (KR) ........................ 10-2024-0043082

(51) Int. Cl.

*G11C 16/08* (2006.01)
*G11C 16/10* (2006.01)
*G11C 16/12* (2006.01)

(52) U.S. Cl.

CPC ............ *G11C 16/08* (2013.01); *G11C 16/102* (2013.01); *G11C 16/12* (2013.01)

(58) Field of Classification Search

CPC ...................................................... G11C 16/08
USPC ..................................................... 365/230.06
See application file for complete search history.

(56) References Cited

U.S. PATENT DOCUMENTS 9,183,940 B2 * 11/2015 Lee ..................... G11C 11/5628
10,546,641 B1 * 1/2020 Vahidimowlavi ........ G11C 8/08
2020/0152256 A1 * 5/2020 Seo .......................... G11C 7/02

FOREIGN PATENT DOCUMENTS

KR 1020210010726 A 1/2021
KR 1020220162599 A 12/2022

* cited by examiner

*Primary Examiner* — Muna A Techane

(74) *Attorney, Agent, or Firm* — WILLIAM PARK AND ASSOCIATES LTD.

(57) ABSTRACT

The present technology relates to a memory system. A memory device according to the present technology may include a memory cell array including memory cells connected to a plurality of word lines, a peripheral circuit configured to apply operation voltages to the plurality of word lines during a voltage increase period in which a program voltage is applied to a select word line, selected among the plurality of word lines, until a voltage level of the select word line reaches a target level, and a control logic configured to control the peripheral circuit to apply a step-up voltage to adjacent word lines, adjacent to the select word line, after a predetermined time from the application of the program voltage and apply a step-down voltage to the adjacent word lines before an end of the voltage increase period, and the operation voltages include the program voltage, the step-up voltage, and the step-down voltage.

19 Claims, 9 Drawing Sheets

| WORD LINE GROUP | FIRST GROUP | SECOND GROUP |
|---|---|---|
| WORD LINE RESISTOR | Rs1 | Rs2 |
| STEP-DOWN VOLTAGE APPLICATION TIME | P1 | P2 = P1 + a |
| STEP-DOWN VOLTAGE SIZE | Fix | Fix |

| WORD LINE GROUP | FIRST GROUP | SECOND GROUP |
|---|---|---|
| WORD LINE RESISTOR | Rs1 | Rs2 |
| STEP-DOWN VOLTAGE APPLICATION TIME | Fix | Fix |
| STEP-DOWN VOLTAGE SIZE | Vsd1 | Vsd2 = Vsd1 − b |

| WORD LINE GROUP | FIRST GROUP | SECOND GROUP |
|---|---|---|
| WORD LINE RESISTOR | Rs1 | Rs2 |
| STEP-DOWN VOLTAGE APPLICATION TIME | P1 | P3 = P1 + a × A |
| STEP-DOWN VOLTAGE SIZE | Vsd1 | Vsd3 = Vsd1 − b × B |

MEMORY DEVICE AND METHOD OF PERFORMING PROGRAM OPERATION

CROSS-REFERENCE TO RELATED APPLICATION

The present application claims priority under 35 U.S.C. § 119(a) to Korean patent application number 10-2024-0043082 filed on Mar. 29, 2024, in the Korean Intellectual Property Office, the entire disclosure of which application is incorporated by reference herein.

BACKGROUND

1. Field of Invention

The present disclosure relates to a memory device, and particularly to a memory device and a method of performing a program operation.

2. Description of Related Art

A memory device is divided into a volatile memory device and a non-volatile memory device. The volatile memory device is a memory device that stores data only when power is supplied and stored data is destroyed when power supply is cut off. The non-volatile memory device is a memory device in which data is not destroyed even though power is cut off.

The memory device may perform a program operation by applying a program voltage through a word line connected to memory cells. As the number of memory cells included in the memory device increases, the program voltages applied to each of the memory cells may be different. Even for memory cells connected to the same word line, the amount of the program voltage applied to the memory cell may be different according to a position of the memory cell. A program speed of a memory cell to which the program voltage is applied later may be slower than a program speed of a memory cell to which the program voltage is applied first. When the program speeds of the memory cells connected to the same word line are different, a limitation voltage distribution of programmed memory cells may deteriorate or the time required to perform a verify operation may increase.

SUMMARY

According to an embodiment of the present disclosure, a memory device may include a memory cell array including memory cells connected to a plurality of word lines, a peripheral circuit configured to apply operation voltages to the plurality of word lines during a voltage increase period in which a program voltage is applied to a select word line, selected among the plurality of word lines, until a voltage level of the select word line reaches a target level, and a control logic configured to control the peripheral circuit to apply a step-up voltage to adjacent word lines, adjacent to the select word line, after a predetermined time from the application of the program voltage, and apply a step-down voltage to the adjacent word lines before an end of the voltage increase period, and the operation voltages include the program voltage, the step-up voltage, and the step-down voltage.

According to an embodiment of the present disclosure, a memory device may include a memory cell array including memory cells connected to M word lines, a peripheral circuit configured to apply operation voltages to the M word lines during a voltage increase period in which a voltage level of an Nth word line, selected among the M word lines, increases to a target level, and a control logic configured to control the peripheral circuit to apply a step-up voltage to an (N±1)th word lines, adjacent to the Nth word line, for a first period of time after a program voltage is applied to the Nth word line and apply a step-down voltage, the step-down voltage being different from the step-up voltage, to the (N±1)th word lines for a second period of time after the first period of time, and the peripheral circuit may apply the step-up voltage and the step-down voltage to the (N±1)th word lines in the voltage increase period.

According to an embodiment of the present disclosure, a method of operating a memory device may include applying a program voltage to a select word line selected among a plurality of word lines connected to memory cells, applying a step-up voltage to adjacent word lines, adjacent to the select word line, for a first period of time after the program voltage is applied, and applying a step-down voltage, the step-down voltage being less than the step-up voltage, to the adjacent word lines for a second period of time after the first period of time, and the step-up voltage and the step-down voltage may be applied to the adjacent word lines in a voltage increase period in which a voltage level of the select word line increases to a target level.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a memory device and a method of performing a program operation that match a program speed of memory cells connected to the same word line.

According to the technology, a memory device and a method of performing a program operation that may improve a threshold voltage distribution of memory cells by controlling program speeds of each of memory cells connected to a select word line to be the same by applying a step-down voltage to adjacent word lines before a program voltage increase period end of the select word line.

Figure 1:
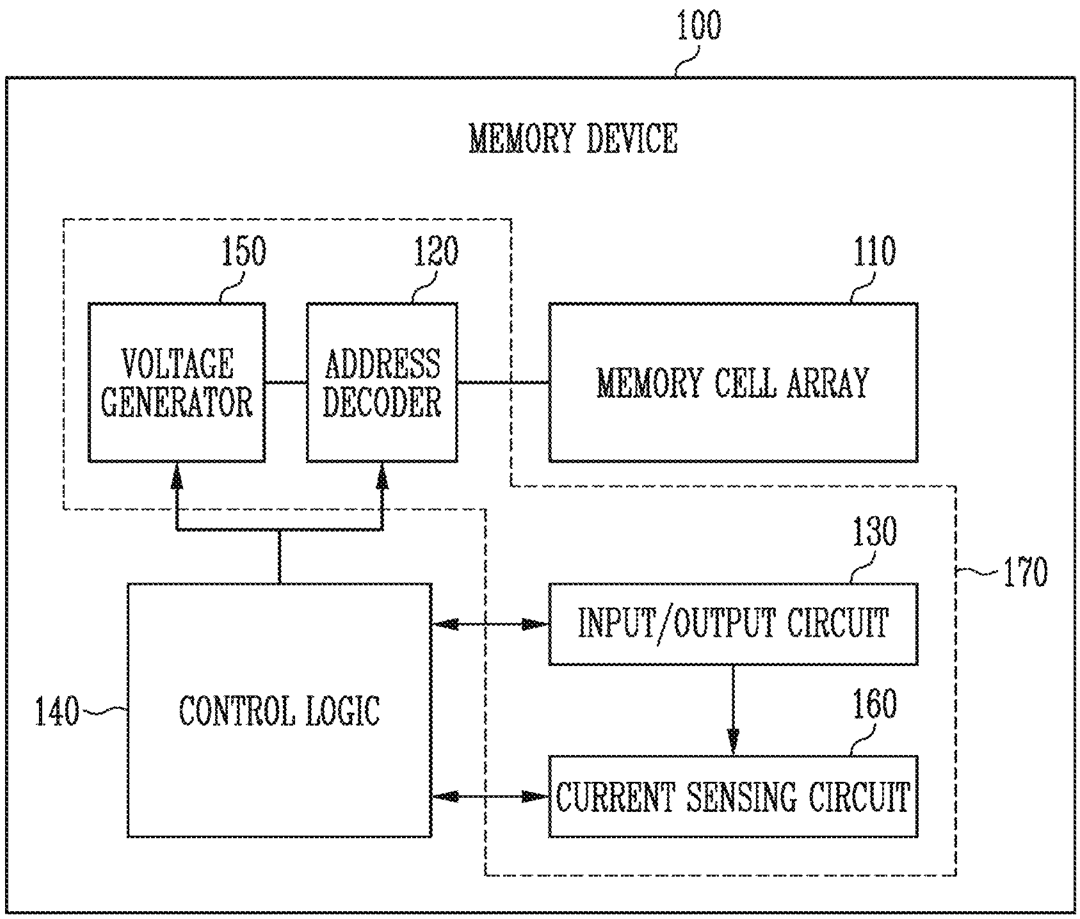
FIG. 1 is a diagram illustrating a memory device according to an embodiment of the present disclosure.

FIG. 1 is a diagram illustrating a memory device according to an embodiment of the present disclosure.

Referring to FIG. 1, the memory device 100 may store data. The memory device 100 may include a memory cell array 110 including memory cells that store data, an address decoder 120 that decodes a column address, an input/output circuit 130 that transmits and receives data to and from a device external to the memory device 100, a control logic 140, a voltage generator 150 that generates a plurality of voltages having various voltage levels, and a current sensing circuit 160 that senses a sensing current flowing in a bit line during a verify operation.

Each of the memory cells included in the memory cell array 110 may be a single-level cell (SLC) that stores 1 bit of data or a memory cell that stores multi-bit data. The memory cells that store the multi-bit data may be a multi-level cell (MLC) that store 2 bits of data, a triple-level cells (TLC) that store 3 bits of data, or a quad-level cell (QLC) that stores 4 bits of data according to the number of bits of the multi-bit data.

The address decoder 120 may be connected to the memory cell array 110 through word lines. The address decoder 120 may select a word line by decoding an address received from the input/output circuit 130. The address decoder 120 may apply a voltage received from the voltage generator 150 to a selected word line. The address decoder 120 may operate in response to control of the control logic 140.

The input/output circuit 130 may include page buffers that read and temporarily store data stored in the memory cells. The input/output circuit 130 may output data stored in the page buffers to a device external to the memory device 100 or store data received from the external device in the page buffer and then store the data in the memory cells. The page buffers may sense a change in an amount of a current flowing according to a program state of the memory cell through a sensing node and may latch the change as sensing data. The input/output circuit 130 may transmit the latched sensing data to the control logic 140.

The control logic 140 may control an overall operation of the memory device 100. The control logic 140 may generate a control signal that controls the address decoder 120, the input/output circuit 130, the voltage generator 150, and the current sensing circuit 160 to perform a read operation, a program operation, and an erase operation for the memory cell array 110.

The voltage generator 150 may generate voltages necessary for an operation of the memory device 100. The voltage generator 150 may generate a program voltage, a verify voltage, and a read voltage required by the memory device 100. The voltages generated by the voltage generator 150 may be supplied to the memory cell array 110 by the address decoder 120.

The current sensing circuit 160 may compare a reference voltage generated based on an allowable bit received from the control logic 140 with a sensing voltage or may compare a generated reference current with a sensing current to generate a pass signal or fail signal during the verify operation.

In an embodiment of the present disclosure, the address decoder 120, the input/output circuit 130, the voltage generator 150, and the current sensing circuit 160 may be referred to as a peripheral circuit 170. The control logic 140 may control the peripheral circuit 170 so that an operation is performed in the memory cells included in the memory cell array 110.

In an embodiment of the present disclosure, the voltage generator 150 may generate a step-up voltage and a step-down voltage to be applied to adjacent word lines adjacent to the select word line while the program voltage is being applied to the select word line. The address decoder 120 may apply the step-up voltage and the step-down voltage to the adjacent word lines according to a control signal of the control logic 140.

The control logic 140 may control the peripheral circuit 170 to apply the step-up voltage and the step-down voltage to the adjacent word lines during a voltage increase period in which the program voltage is applied to the select word line until a voltage level of the select word line reaches a target level. The control logic 140 may control an application speed, the speed at which the program voltage is applied to the memory cells by using coupling generated by a voltage applied to the adjacent word lines. Specifically, the control logic 140 may increase the application speed of the program voltage by applying the step-up voltage, which is higher than a pass voltage, to the adjacent word lines or may decrease the application speed of the program voltage by applying the step-down voltage, which is lower than the step-up voltage, to the adjacent word lines.

Figure 2:
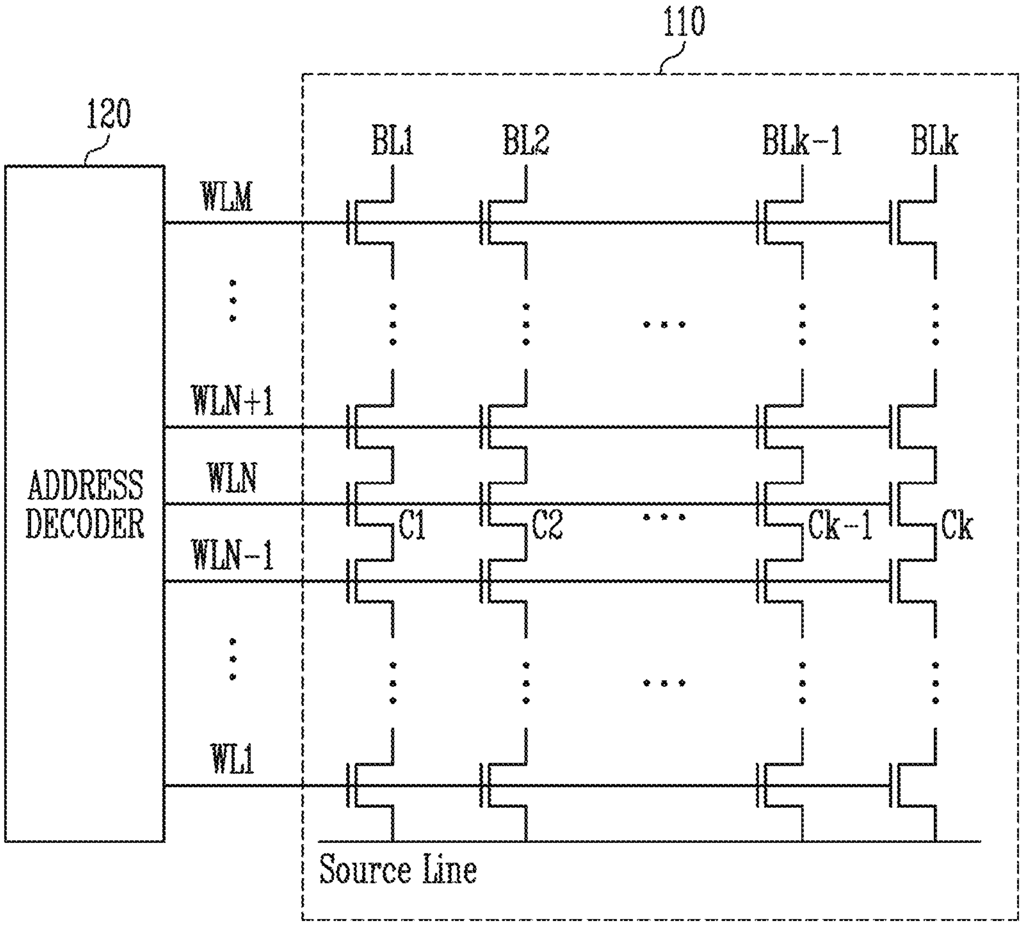
FIG. 2 is a diagram illustrating a memory cell array and an address decoder of FIG. 1.

FIG. 2 is a diagram illustrating the memory cell array and the address decoder of FIG. 1.

Referring to FIG. 2, the memory cells included in the memory cell array 110 may be connected to the address decoder 120 through a plurality of word lines. In FIG. 2, it may be assumed that M word lines are connected to the memory cells, and the number of memory cells connected to one word line is k.

The memory cells may be connected in series between a bit line and a source line. A gate of a plurality of memory cells may be connected to one word line. For convenience of description, it may be assumed that, among the M word lines, an Nth word line is the select word line, and (N±1)th word lines are the adjacent word lines. Memory cells C1 to Ck connected to the Nth word line may be the select memory cells.

A distance between the address decoder 120 and each of the select memory cells may be different. Among the select memory cells, a first memory cell C1 may be closest to the address decoder 120, and a k-th memory cell Ck may be farthest from the address decoder 120.

As the distance between the address decoder 120 and the select memory cell increases, the program voltage applied through the select word line may be delayed in reaching the gate of the select memory cell. Even though the address decoder 120 applies the same program voltage to the select word line, the application speed of the program voltage applied to each of the select memory cells may be different according to the distance between the address decoder 120 and the select memory cell. As the distance between the address decoder 120 and the memory cell increases, the program voltage may take a longer period of time to reach the memory cell, and the application speed of the program voltage applied to the gate of the memory cell decreases. For example, among the select memory cells, the application speed of the program voltage applied to the first memory cell C1 may be the fastest, and the application speed of the program voltage applied to the k-th memory cell Ck may be the slowest.

The address decoder 120 may apply the program voltage to the select word line and may apply the step-up voltage or the step-down voltage to the adjacent word lines according to a control signal of the control logic 140. Coupling in which a voltage of the adjacent word lines changed by the voltage applied to the adjacent word lines affects a voltage of the select word line may occur. The control logic 140 may control an application speed of a voltage level of the select word line by using coupling.

In FIG. 2, the (N±1)th word lines are assumed as the adjacent word lines, but this is only an embodiment, and (N±2)-th word lines or (N±3)-th word lines may also become the adjacent word lines.

Figure 3:
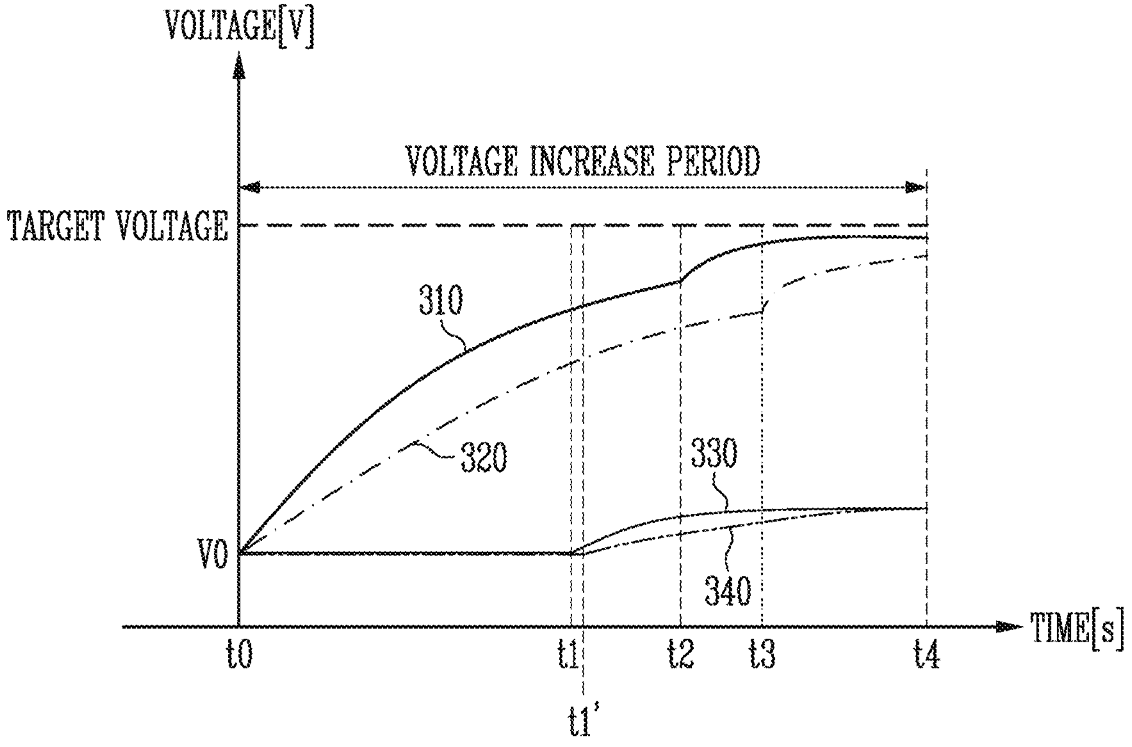
FIG. 3 is a diagram illustrating a voltage increase of a select word line according to an embodiment of the present disclosure.

FIG. 3 is a diagram illustrating a voltage increase of a select word line according to an embodiment of the present disclosure.

Referring to FIG. 3, the program voltage applied to the gate of the select memory cell may increase based on an application of the program voltage through the select word line. It may be assumed that the program voltage is applied to the select word line at to, and an initial voltage of the word lines may be V0. A time at which the voltage level of the select word line reaches the target voltage level may be t4, and a period from to to t4 may be the voltage increase period of the program voltage.

Describing FIGS. 2 and 3 together, it may be assumed that 310 represents a potential of the program voltage applied to the first memory cell C1, and 320 represents the potential of the program voltage applied to the k-th memory cell Ck. It may be assumed that 330 represents a potential applied to a first adjacent memory cell adjacent to the first memory cell C1, among the adjacent memory cells connected to the adjacent word line, and 340 represents a potential applied to a k-th adjacent memory cell adjacent to the k-th memory cell Ck.

Since the program voltage is applied to the select word line at t0, 310 and 320 may increase. Since the address decoder 120 is closer to the first memory cell C1 than the k-th memory cell Ck, the potential of 310 may increase faster than that of 320.

Since the step-up voltage is applied to the adjacent word lines at t1, 330 and 340 may be increase. Since the address decoder 120 is closer to the first adjacent memory cell than the k-th adjacent memory cell, 330 may increase faster than 340, just as in the case of the select memory cells. 340 may be delayed compared to 330 and may increase at t1' instead of t1. When 330 and 340 are increased, coupling may occur to increase 310 and 320.

At t2, 310 may increase according to a first coupling that occurs due to the increase of 330. An application speed of 310 may increase. At t3, 320 may increase according to a second coupling that occurs due to the increase of 340. Since 340 is delayed compared to 330, the second coupling may also be delayed compared to the first coupling. Since the second coupling is delayed compared to the first coupling, 310 may increase faster than 320.

Figure 4:
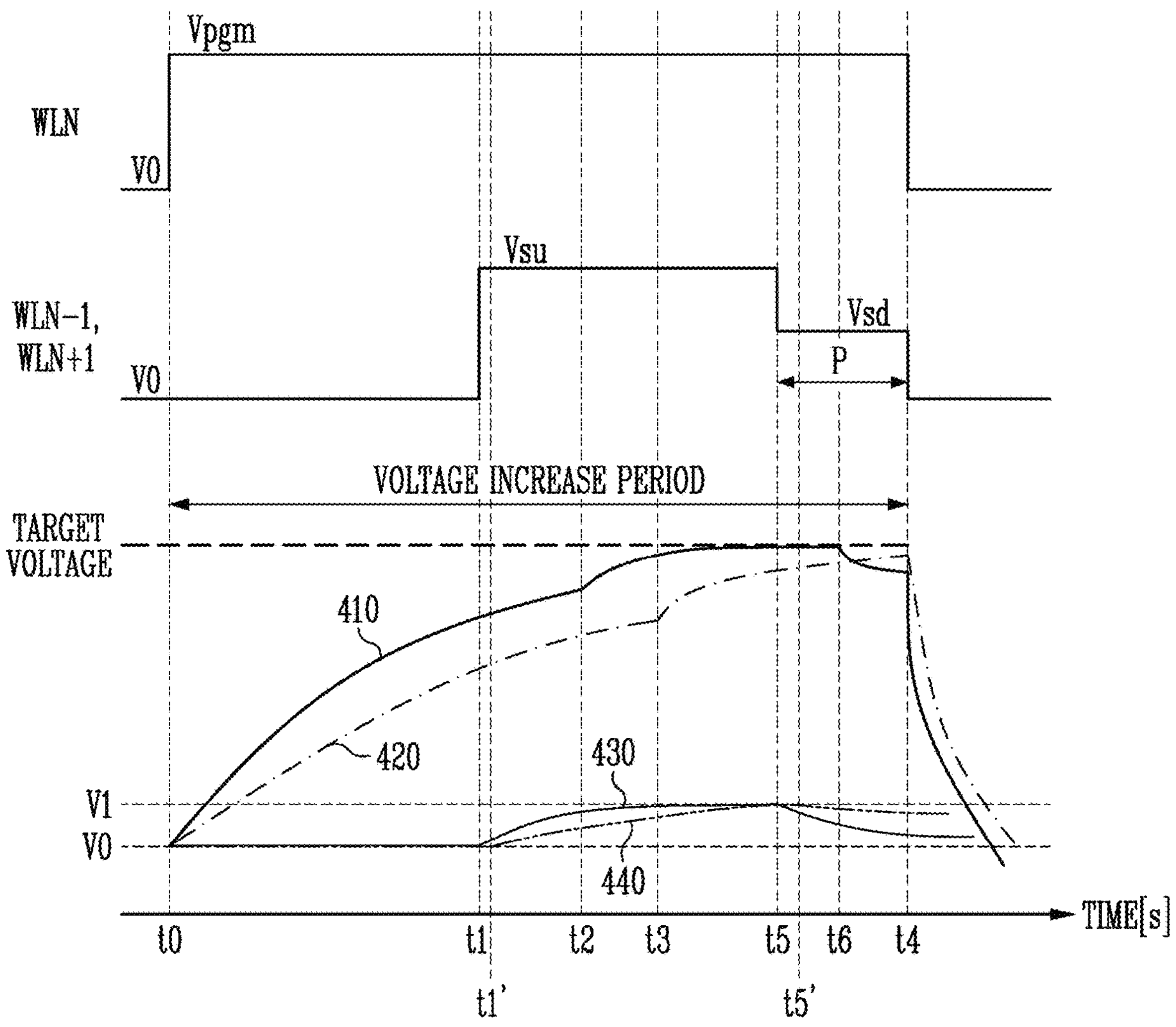
FIG. 4 is a diagram illustrating an application of a step-down voltage for controlling an application speed of a program voltage applied to memory cells according to an embodiment of the present disclosure.

FIG. 4 is a diagram illustrating an application of the step-down voltage for controlling an application speed of a program voltage applied to memory cells according to an embodiment of the present disclosure.

Referring to FIG. 4, a voltage and a timing thereof applied to the Nth word line WLN and the (N±1)th word lines WLN+1 and WLN−1 is shown. FIG. 4 illustrates a potential of the memory cells according to the voltage applied to the Nth word line WLN and the N±1-th word lines WLN+1 and WLN−1.

In FIG. 4, it may be assumed that the Nth word line WLN of FIG. 2 is the select word line, and the (N±1)th word lines WLN+1 and WLN−1 of FIG. 2 are the adjacent word lines. Before t0, the voltage applied to the word lines may be the initial voltage V0. Similarly to FIG. 3, a step-up voltage Vsu may be applied to the adjacent word lines at t1. However, in contrast to FIG. 3, a step-down voltage Vsd may be applied to the adjacent word lines at t5.

In FIG. 4, a description of parts that overlap with that of FIG. 3 is omitted. In FIGS. 4, 410, 420, 430, and 440 may correspond to 310, 320, 330, and 340 of FIGS. 3. 430 and 440 may converge at V1 based on the step-up voltage Vsu.

At t5, 430 and 440 may decrease based on the step-down voltage Vsd applied to the corresponding adjacent word lines. With regard to a decrease of potentials of 430 and 440, 440 may be delayed compared to 430, just as in the case of an increase of a potential. 430 may decrease from t5, and 440 decreases from t5'. 410 may decrease at t6 due to the decrease of 430. A third coupling according to the decrease of 430 may decrease the potential of 410. Since the potential of 410 decreases, the application speed of the program voltage applied to the first memory cell C1 may decrease.

Since 440 decreases from t5', a fourth coupling due to the decrease of 440 may occur. However, the fourth coupling may be delayed compared to the third coupling and may affect 420. In an embodiment of the present disclosure, the control logic 140 may block an influence of the fourth coupling on the 420 by controlling a size and an application time P of the step-down voltage Vsd. In FIG. 4, 440 may decrease, but since the fourth coupling does not affect 420, the speed at which the program voltage is applied to the k-th memory cell Ck may be maintained. In an embodiment of the present disclosure, the control logic 140 may determine the size and the application time P of the step-down voltage Vsd at which the application speed of the program voltage applied to the k-th memory cell Ck is maintained despite an application of the step-down voltage Vsd.

In an embodiment of the present disclosure, the control logic 140 may determine at least one of the size or the application time P of the step-down voltage Vsd based on the application speed of the program voltages applied to each of the select memory cells connected to the select word line. The application speed of the program voltages may be determined based on the distance between each of the corresponding select memory cells and the address decoder 120. Coupling that occurs according to the voltage applied to the adjacent word line may affect the speed at which the program voltages are applied. As the influence of coupling increases, an amount of increase and an amount of decrease of the program voltages may increase. The influence of coupling may be determined based on the distance between each of the corresponding select memory cells and the address decoder 120.

The control logic 140 may determine at least one of the size or the application time P of the step-down voltage Vsd so that the application speed of the memory cell having the shortest distance to the address decoder 120, among the select memory cells, is the same as the application speed of the memory cell having the longest distance to the address decoder 120, among the select memory cells. In another embodiment of the present disclosure, the control logic 140 may determine at least one of the size or the application time P of the step-down voltage Vsd so that a difference of application speeds between each of the corresponding select memory cells is less than a limit value. The limit value of an application speed difference may be a predetermined value.

Figure 5:
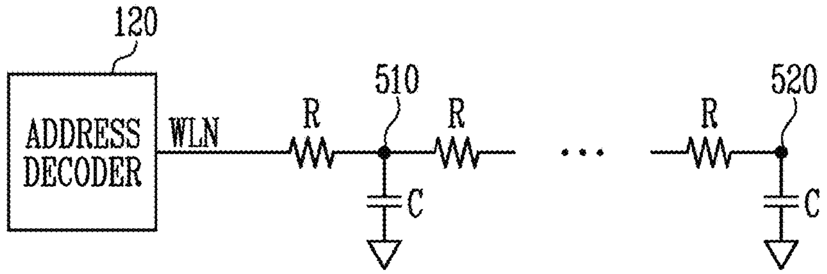
FIG. 5 is a diagram illustrating an application speed difference of a program voltage applied to memory cells according to an embodiment of the present disclosure.

FIG. 5 is a diagram illustrating an application speed difference of a program voltage applied to memory cells according to an embodiment of the present disclosure.

Referring to FIG. 5, an equivalent model of the select memory cells connected to the Nth word line WLN, which is the select word line, may be shown. The equivalent model may be expressed using a resistance R and a capacitor C. The select word line may connect the address decoder 120 and the select memory cells.

In FIG. 5, a voltage of each of capacitors may be $$Vwl\left(1 - e^{\frac{-t}{Rtot \times Ctot}}\right).$$

At this time, Vwl may be a voltage applied to the word line, Rtot may be a resistance value connected between a capacitor and the address decoder 120, and Ctot may be a capacitance connected between the capacitor and the address decoder 120. As the distance to the address decoder 120 increases, the resistance value may increase because a resistor is connected in series, and the capacitance may increase because the capacitor is connected in parallel. Therefore, as the distance to the address decoder 120 increases, the application speed of the program voltage applied to the gate of the memory cell decreases.

Referring to FIG. 5 in light of FIG. 2, it may be assumed that a potential of a first node 510 represents a potential of the program voltage applied to the first memory cell C1, and a potential of a k-th node 520 represents the potential of the program voltage applied to the k-th memory cell Ck. A resistance value from the address decoder 120 to the first node 510 may be R, and a capacitance may be C. Since the resistance value and the capacitance from the address decoder 120 to the k-th node 520 are greater than the resistance value R and the capacitance C of the first node 510, the application speed of the program voltage applied to the first memory cell C1 may be faster than the application speed of the program voltage applied to the k-th memory cell Ck. That is, the voltage applied to the k-th memory cell Ck may be delayed compared to the voltage applied to the first memory cell C1.

Figure 6:
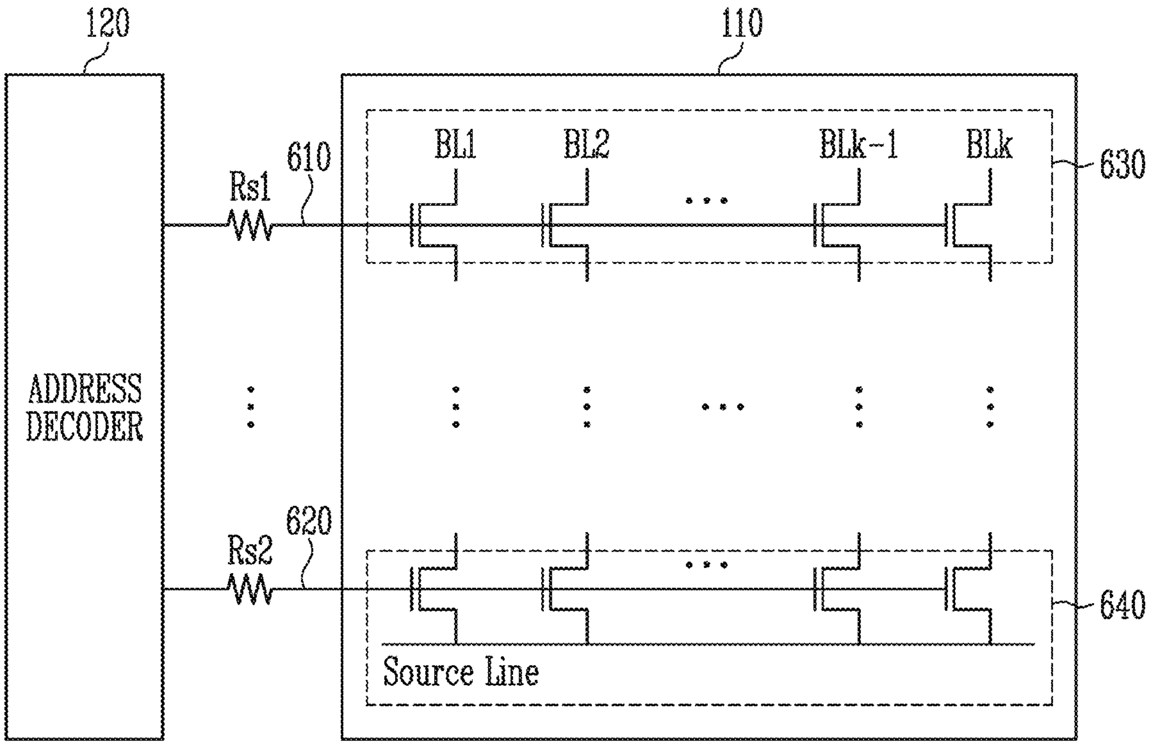
FIG. 6 is a diagram illustrating a group of memory cells according to a word line resistance according to an embodiment of the present disclosure.

FIG. 6 is a diagram illustrating a group of memory cells according to a word line resistance according to an embodiment of the present disclosure.

Referring to FIG. 6, a first word line of which a word line resistance is Rs1 and a second word line of which a word line resistance is Rs2 is shown. It may be assumed that Rs1 is less than Rs2. The memory cells included in the memory cell array 110 may be divided into a first group 630 and a second group 640 according to a word line resistance. In FIG. 6, for convenience of description, two word line resistors and two word line groups are shown. However, this is merely an example and is not limited thereto.

In FIG. 6, the address decoder 120 and the memory cell array 110 may be connected through word lines. The control logic 140 may group the memory cells included in the memory cell array 110 based on the resistance of the word line. The memory cell array 110 may correspond to the memory cell array of FIGS. 1 and 2.

In an embodiment of the present disclosure, the control logic 140 may determine at least one of the size or the application time of the step-down voltage based on the resistance of the word line. The control logic 140 may increase at least one of the size or the application time of the step-down voltage as the resistance of the word line increases. The resistance of the word line may be determined based on the distance between the address decoder 120 and the corresponding memory cells connected to the word line. Since the resistance of the word line of the same memory cell group is the same, the control logic 140 may determine the size and the application time of the step-down voltage of the same memory cell group to be the same.

Figure 7:
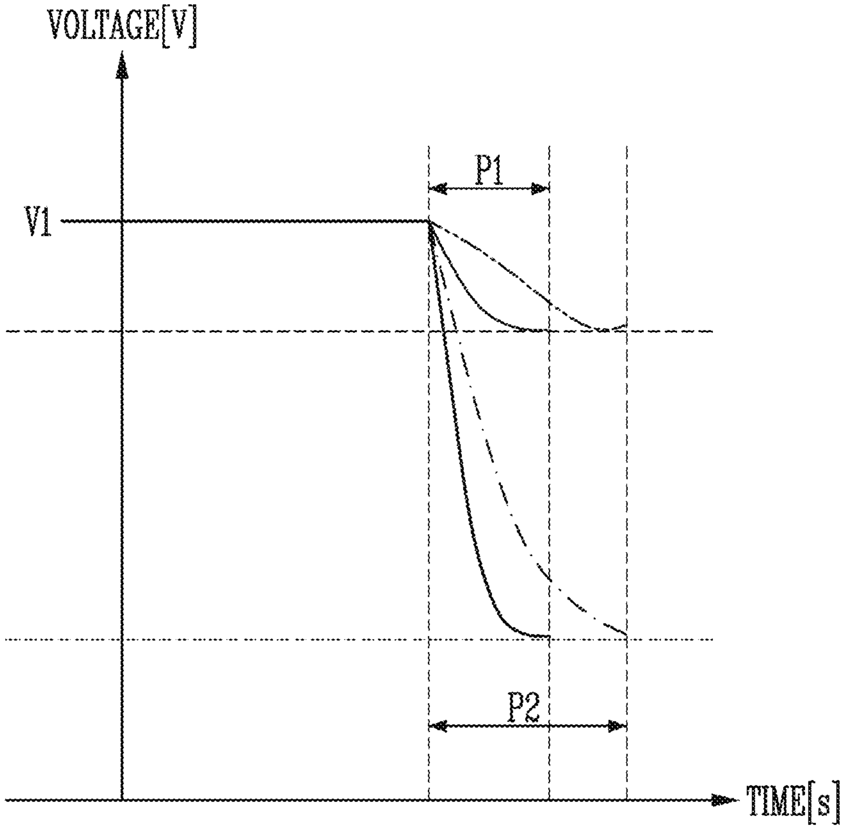
FIGS. 7 to 9 are diagrams illustrating various embodiments of a size and an application time of a step-down voltage according to an embodiment of the present disclosure.
Figure 8:
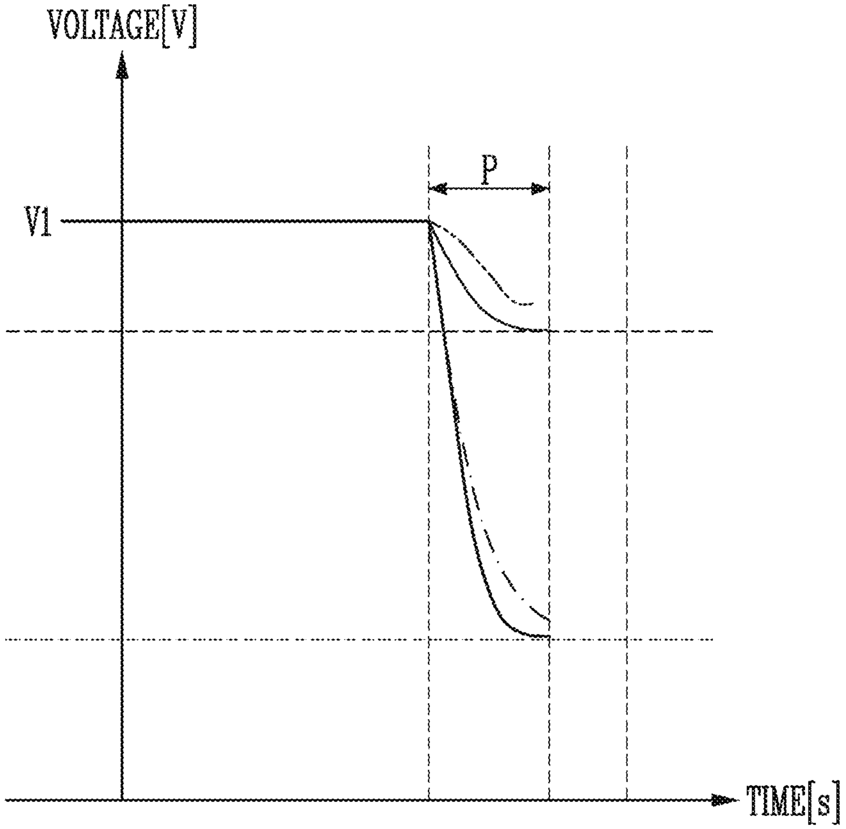
Figure 9:
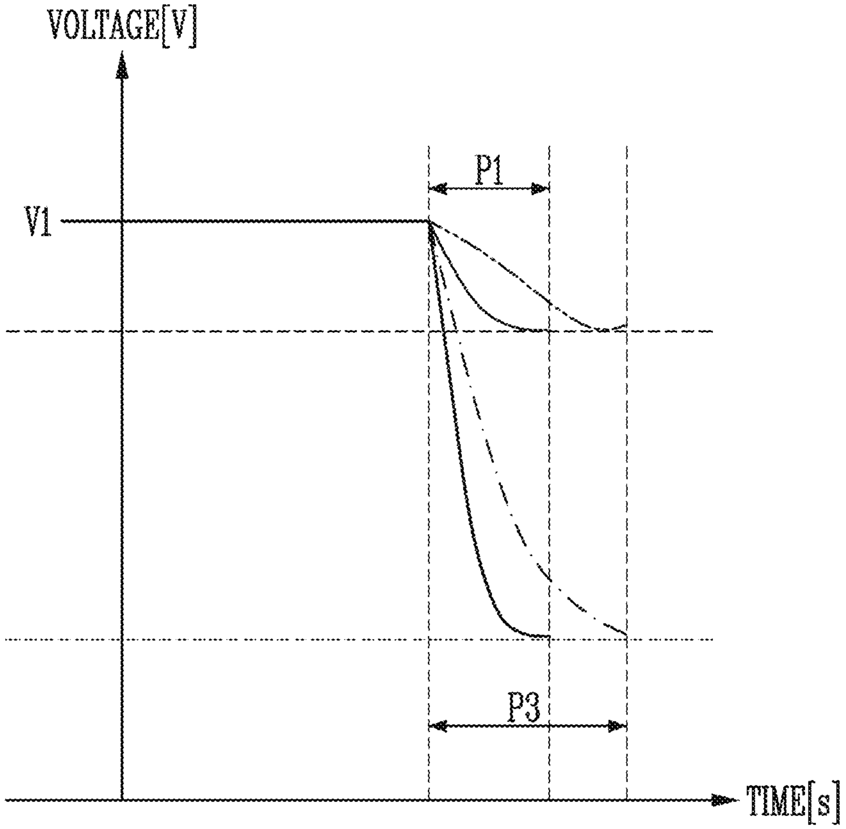

FIGS. 7 to 9 are diagrams illustrating various embodiments of a size and an application time of a step-down voltage according to an embodiment of the present disclosure.

FIGS. 7 to 9 may be described together with FIGS. 5 and 6. A memory cell group may be divided into a first group and a second group according to the resistance of the word line. In FIGS. 7 to 9, a thick line of a graph may represent a potential of an adjacent memory cell corresponding to the first node 510, and a thin line of the graph may represent a potential of an adjacent memory cell corresponding to the k-th node 520. A solid line of the graph may represent the first group, and a dotted line of the graph may represent the second group.

FIG. 7 illustrates a case in which the size of the step-down voltage is maintained, and the application time of the step-down voltage is changed. The word line resistance Rs1 of the first group may be less than the word line resistance Rs2 of the second group. A step-down voltage application time of the first group may be P1, and a step-down voltage application time of the second group may be P2. P2 may be greater than P1 by a.

FIG. 8 illustrates a case in which the application time of the step-down voltage is maintained, and the size of the step-down voltage is changed. The size of the step-down voltage of the first group may be Vsd1, and the size of the step-down voltage of the second group may be Vsd2. Vsd2 may be less than Vsd1 by b.

FIG. 9 illustrates a case in which both of the size and the application time of the step-down voltage are changed. The step-down voltage application time of the first group may be P1, and the size of the step-down voltage of the first group may be Vsd1. The step-down voltage application time of the second group may be P3, and the size of the step-down voltage of the second group may be Vsd3. P3 may be greater than P1 by a*A. A may be a weight of the step-down voltage application time. Vsd3 may be less than Vsd1 by b*B. B may be a weight of the step town voltage size. At this time, A+B=1 may be satisfied.

In another embodiment of the present disclosure, the control logic 140 may apply the step-down voltage to only one adjacent word line. For example, when the select word line is the Nth word line, the step-down voltage may be applied only to the (N+1)th word line or the (N−1)th word line. The control logic 140 may control the peripheral circuit so that the step-down voltage is applied to only one word line selected among the (N±1)th word lines based on a degree to which a voltage level of the Nth word line decreases according to the step-down voltage.

Figure 10:
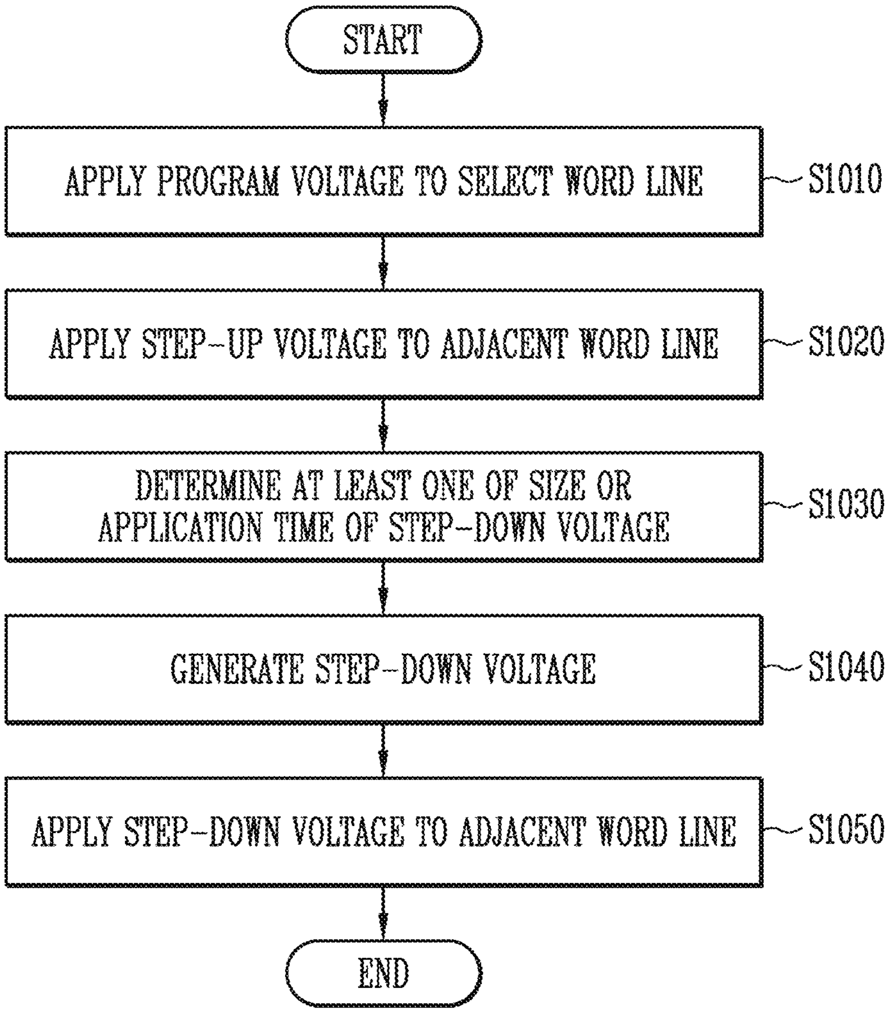
FIG. 10 is a flowchart illustrating a method of controlling an application speed of a program voltage applied to memory cells according to an embodiment of the present disclosure.

FIG. 10 is a flowchart illustrating a method of controlling an application speed of a program voltage applied to memory cells according to an embodiment of the present disclosure.

Referring to FIG. 10, the memory device may apply the step-down voltage to the adjacent word line adjacent to the select word line. The step-down voltage may decrease the application speed of the program voltage applied to the select memory cells connected to the select word line. The memory device may control the application speed of the program voltage applied to the memory cells to match the slowest memory cell.

In step S1010, the control logic may apply the program voltage to the select word line selected among the plurality of word lines connected to the memory cells. The control logic may apply the pass voltage to unselect word lines, among the plurality of word lines.

In step S1020, the control logic may apply the step-up voltage to the adjacent word lines adjacent to the select word line for a first period of time after the program voltage is applied. In step S1030, the control logic may determine at least one of the size or the application time of the step-down voltage based on the application speed of the program voltages applied to each of the select memory cells connected to the select word line.

In step S1040, the control logic may generate the determined step-down voltage. In step S1050, the control logic may apply the step-down voltage, the step-down voltage being a voltage size that is less than the step-up voltage, to the adjacent word lines for a second period of time after the step-up voltage is applied.

Each of steps of FIG. 10 may correspond to the description of FIGS. 1 to 9.

What is claimed is:

1. A memory device comprising:

a memory cell array including memory cells connected to a plurality of word lines;

a peripheral circuit configured to apply operation voltages to the plurality of word lines during a voltage increase period in which a program voltage is applied to a select word line, selected among the plurality of word lines, until a voltage level of the select word line reaches a target level; and a control logic configured to control the peripheral circuit to:

apply a step-up voltage to adjacent word lines, adjacent to the select word line, after a predetermined time from the application of the program voltage, and apply a step-down voltage to the adjacent word lines before an end of the voltage increase period, wherein the operation voltages include the program voltage, the step-up voltage, and the step-down voltage.

2. The memory device of claim 1, wherein the control logic is configured to determine at least one of a size or an application time of the step-down voltage based on an application speed of program voltages applied to each of select memory cells connected to the select word line.

3. The memory device of claim 2, wherein the peripheral circuit includes an address decoder that selects one word line, among the plurality of word lines, based on an address received from the control logic, and wherein the application speed is determined based on a distance between each of the select memory cells and the address decoder.

4. The memory device of claim 3, wherein the control logic is configured to determine at least one of the size or the application time of the step-down voltage so that an application speed of a memory cell that is closest to the address decoder, among the select memory cells, is the same as an application speed of a memory cell that is farthest from the address decoder, among the select memory cells.

5. The memory device of claim 1, wherein the control logic is configured to determine at least one of a size or an application time of the step-down voltage based on a resistance of the select word line.

6. The memory device of claim 5, wherein the peripheral circuit includes an address decoder that selects one word line, among the plurality of word lines, based on an address received from the control logic, and wherein the resistance of the select word line is determined based on a distance between the address decoder and select memory cells connected to the select word line.

7. The memory device of claim 6, wherein the control logic is configured to increase at least one of the size or the application time of the step-down voltage as the resistance of the select word line increases.

8. A memory device comprising:

a memory cell array including memory cells connected to M word lines;

a peripheral circuit configured to apply operation voltages to the M word lines during a voltage increase period in which a voltage level of an Nth word line, selected among the M word lines, increases to a target level; and a control logic configured to control the peripheral circuit to:

apply a step-up voltage to (N±1)th word lines, adjacent to the Nth word line, for a first period of time after a program voltage is applied to the Nth word line, and apply a step-down voltage, the step-down voltage being different from the step-up voltage, to the (N±1)th word lines for a second period of time after the first period of time, wherein the peripheral circuit is configured to apply the step-up voltage and the step-down voltage to the (N±1)th word lines in the voltage increase period.

9. The memory device of claim 8, wherein the control logic is configured to determine at least one of a size or an application time of the step-down voltage based on an application speed of program voltages applied to each of select memory cells connected to the Nth word line.

10. The memory device of claim 9, wherein the control logic is configured to determine at least one of the size or the application time of the step-down voltage so that a difference in the application speed between each of the select memory cells is less than a limit value.

11. The memory device of claim 8, wherein the control logic is configured to determine at least one of a size or an application time of the step-down voltage based on a resistance of the Nth word line.

12. The memory device of claim 11, wherein the peripheral circuit includes an address decoder that selects one word line, among the plurality of word lines, based on an address received from the control logic, and wherein a resistance of the Nth word line is determined based on a distance between the address decoder and each select memory cell connected to the Nth word line.

13. The memory device of claim 12, wherein the control logic is configured to increase at least one of the size or the application time of the step-down voltage as the resistance of the Nth word line increases.

14. The memory device of claim 8, wherein the control logic is configured to control the peripheral circuit so that the step-down voltage is applied to only one word line, selected among the (N±1)th word lines, based on a degree to which a voltage level of the Nth word line decreases according to the step-down voltage.

15. A method of operating a memory device, the method comprising:

applying a program voltage to a select word line, selected among a plurality of word lines connected to memory cells;

applying a step-up voltage to adjacent word lines, adjacent to the select word line, for a first period of time after the program voltage is applied; and applying a step-down voltage, the step-down voltage being less than the step-up voltage, to the adjacent word lines for a second period of time after the first period of time, wherein the step-up voltage and the step-down voltage are applied to the adjacent word lines in a voltage increase period in which a voltage level of the select word line increases to a target level.

16. The method of claim 15, wherein the applying of the step-down voltage comprises:

determining at least one of a size or an application time of the step-down voltage based on an application speed of program voltages applied to each of select memory cells connected to the select word line; and generating the determined step-down voltage.

17. The method of claim 16, wherein the determining of at least one of the size or the application time of the step-down voltage comprises:

determining at least one of the size or the application time of the step-down voltage so that a difference in the application speed between each of the select memory cells is less than a limit value, and wherein the application speed is determined based on a distance between an address decoder that selects one word line, among the plurality of word lines, based on an address and memory cells of the selected word line.

18. The method of claim 15, wherein the applying of the step-down voltage comprises:

determining at least one of a size or an application time of the step-down voltage based on a resistance of the select word line; and generating the determined step-down voltage.

19. The method of claim 18, wherein the determining of at least one of the size or the application time of the step-down voltage comprises:

increasing at least one of the size or the application time of the step-down voltage as the resistance of the select word line increases, and wherein the resistance of the select word line is determined based on a distance between an address decoder that selects one word line, among the plurality of word lines, based on an address and memory cells connected to the selected word line.

* * * * *